(12) United States Patent
Honeycutt et al.

(10) Patent No.: US 7,432,212 B2
(45) Date of Patent: *Oct. 7, 2008

(54) METHODS OF PROCESSING A SEMICONDUCTOR SUBSTRATE

(75) Inventors: Jeffrey W. Honeycutt, Boise, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 99 days.

This patent is subject to a terminal disclaimer.

(21) Appl. No.: 11/490,807

(22) Filed: Jul. 20, 2006

(65) Prior Publication Data

US 2006/0258161 A1 Nov. 16, 2006

Related U.S. Application Data

(63) Continuation of application No. 10/848,030, filed on May 17, 2004, now Pat. No. 7,115,524.

(51) Int. Cl.
*H01L 21/302* (2006.01)
*H01L 21/461* (2006.01)

(52) U.S. Cl. ............... 438/725; 257/E21.024; 257/E21.033; 438/736

(58) Field of Classification Search .......... 257/E21.024, 257/E21.033, E21.035; 438/736, 945, 950, 438/725

See application file for complete search history.

(56) References Cited

U.S. PATENT DOCUMENTS

| 4,382,100 | A | 5/1983 | Holland | 427/38 |
| 4,436,797 | A | 3/1984 | Brady et al. | 430/5 |
| 4,510,176 | A | 4/1985 | Cuthbert et al. | 427/82 |
| 4,675,265 | A | 6/1987 | Kazama et al. | 430/67 |
| 4,732,785 | A | 3/1988 | Brewer | 427/240 |
| 4,886,728 | A | 12/1989 | Salamy et al. | 430/331 |
| 4,994,404 | A | 2/1991 | Sheng et al. | 438/680 |

(Continued)

FOREIGN PATENT DOCUMENTS

JP 11-214290 8/1999

(Continued)

OTHER PUBLICATIONS

PCT/US2004/026517; filed Aug. 22, 2004; International Search Report; 4 pps.

(Continued)

*Primary Examiner*—Caridad M Everhart
(74) *Attorney, Agent, or Firm*—Wells St. John P.S.

(57) ABSTRACT

The invention includes methods of processing semiconductor substrates. In one implementation, a semiconductor substrate is provided which has an outer surface. Such surface has a peripheral region received about a peripheral edge of the semiconductor substrate. A layer comprising amorphous carbon is provided over the substrate outer surface. A masking layer is provided outwardly of the amorphous carbon-comprising layer. A resist layer is provided outwardly of the masking layer. At least a portion of the peripheral region of the outer surface includes the amorphous carbon-comprising layer and the resist layer, but is substantially void of the masking layer. The amorphous carbon-comprising layer is patterned using the resist layer and the masking layer effective to form a mask over the semiconductor substrate. After the patterning, the semiconductor substrate is processed inwardly of the mask through openings formed in the mask.

15 Claims, 7 Drawing Sheets

U.S. PATENT DOCUMENTS

| | | | |
|---|---|---|---|
| 5,433,794 A | 7/1995 | Fazan et al. | 148/333 |
| 5,656,128 A | 8/1997 | Hashimoto et al. | 216/47 |
| 5,679,215 A | 10/1997 | Barnes et al. | 156/646.1 |
| 5,754,390 A | 5/1998 | Sandhu et al. | 361/321.4 |
| 5,788,778 A | 8/1998 | Shang et al. | 134/1 |
| 5,814,433 A | 9/1998 | Nelson et al. | 430/326 |
| 5,952,050 A | 9/1999 | Doan | 525/415 |
| 6,188,097 B1 | 2/2001 | Derderian et al. | 438/348 |
| 6,211,033 B1 | 4/2001 | Sandhu et al. | 438/387 |
| 6,218,237 B1 | 4/2001 | Sandhu et al. | 438/253 |
| 6,238,994 B1 | 5/2001 | Derderian et al. | 438/398 |
| 6,291,315 B1 * | 9/2001 | Nakayama et al. | 438/459 |
| 6,297,112 B1 | 10/2001 | Lin et al. | 438/303 |
| 6,306,702 B1 | 10/2001 | Hao et al. | 438/231 |
| 6,333,255 B1 | 12/2001 | Sekiguchi | 438/621 |
| 6,342,423 B1 | 1/2002 | Ishida et al. | 438/303 |
| 6,344,396 B1 | 2/2002 | Ishida et al. | 438/286 |
| 6,368,986 B1 | 4/2002 | Budge et al. | 438/787 |
| 6,369,431 B1 | 4/2002 | Gonzalez et al. | 257/390 |
| 6,376,284 B1 | 4/2002 | Gonzalez et al. | 257/390 |
| 6,395,602 B2 | 5/2002 | Sandhu et al. | 438/253 |
| 6,399,982 B1 | 6/2002 | Derderian et al. | 438/309 |
| 6,453,916 B1 | 9/2002 | Tran et al. | 134/58 R |
| 6,472,283 B1 | 10/2002 | Ishida et al. | 438/305 |
| 6,475,868 B1 | 11/2002 | Hao et al. | 438/301 |
| 6,495,312 B1 | 12/2002 | Young et al. | 430/328 |
| 6,500,756 B1 | 12/2002 | Bell et al. | 438/639 |
| 6,524,775 B1 | 2/2003 | Oberlander et al. | 430/327 |
| 6,555,432 B2 | 4/2003 | Sandhu et al. | 438/253 |
| 6,559,017 B1 | 5/2003 | Brown et al. | 438/303 |
| 6,605,514 B1 | 8/2003 | Tabery et al. | 438/303 |
| 6,608,343 B2 | 8/2003 | Derderian et al. | 257/309 |
| 6,617,230 B2 | 9/2003 | Budge et al. | 438/595 |
| 6,653,220 B2 | 11/2003 | Ma et al. | 438/618 |
| 6,653,733 B1 | 11/2003 | Gonzalez et al. | 257/758 |
| 6,670,713 B2 | 12/2003 | Gonzalez et al. | 257/758 |
| 6,700,211 B2 | 3/2004 | Gonzalez et al. | 257/910 |
| 6,750,127 B1 | 6/2004 | Chang et al. | 438/585 |
| 6,767,692 B1 * | 7/2004 | Young et al. | 430/311 |
| 6,815,308 B2 | 11/2004 | Holscher et al. | 438/401 |
| 6,875,664 B1 | 4/2005 | Huang et al. | 438/299 |
| 7,074,710 B2 * | 7/2006 | Whitefield et al. | 438/626 |
| 2001/0023123 A1 | 9/2001 | Kim | 438/587 |
| 2002/0088707 A1 | 7/2002 | Towie | 204/192.15 |
| 2002/0185687 A1 | 12/2002 | Koh et al. | 257/347 |
| 2003/0001187 A1 | 1/2003 | Basceri et al. | 257/301 |
| 2003/0011011 A1 | 1/2003 | Basceri et al. | 257/301 |
| 2003/0073309 A1 | 4/2003 | Emami | 438/689 |
| 2004/0043262 A1 | 3/2004 | Chou San et al. | 429/17 |
| 2004/0043574 A1 | 3/2004 | Steiner et al. | 438/303 |
| 2004/0259355 A1 | 12/2004 | Yin et al. | 438/689 |
| 2005/0042879 A1 | 2/2005 | Yin et al. | 438/696 |
| 2005/0056940 A1 | 3/2005 | Sandhu et al. | 257/770 |
| 2005/0059262 A1 | 3/2005 | Yin et al. | 438/780 |
| 2005/0098105 A1 | 5/2005 | Fuss et al. | 118/715 |
| 2005/0255702 A1 | 11/2005 | Honeycutt et al. | 438/725 |

OTHER PUBLICATIONS

PCT/US04/026517; filed Aug. 2004; Written Opinion: 6 pps.

* cited by examiner

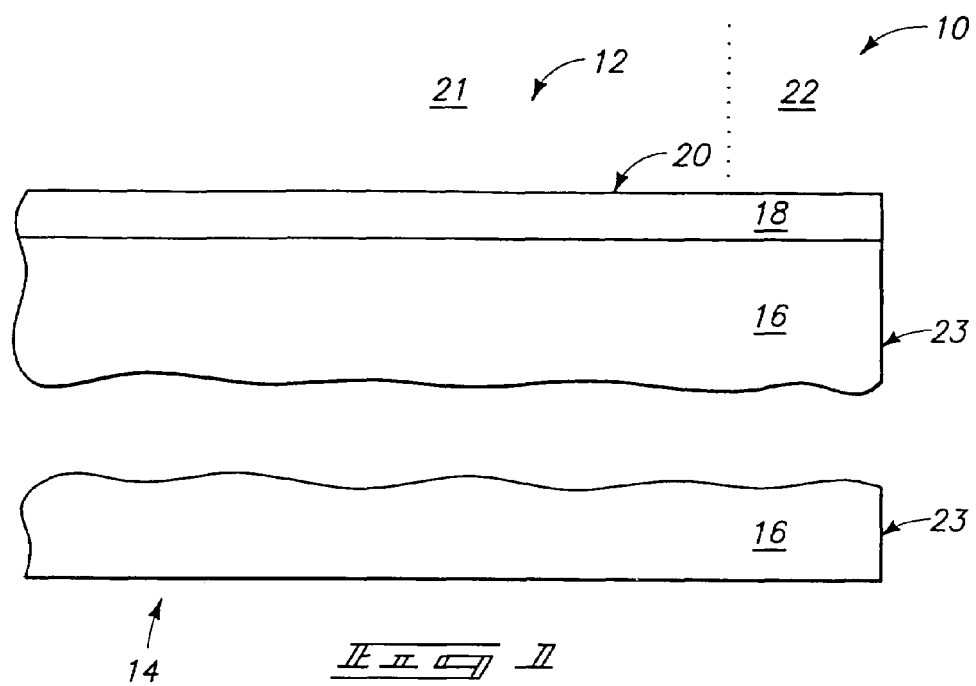
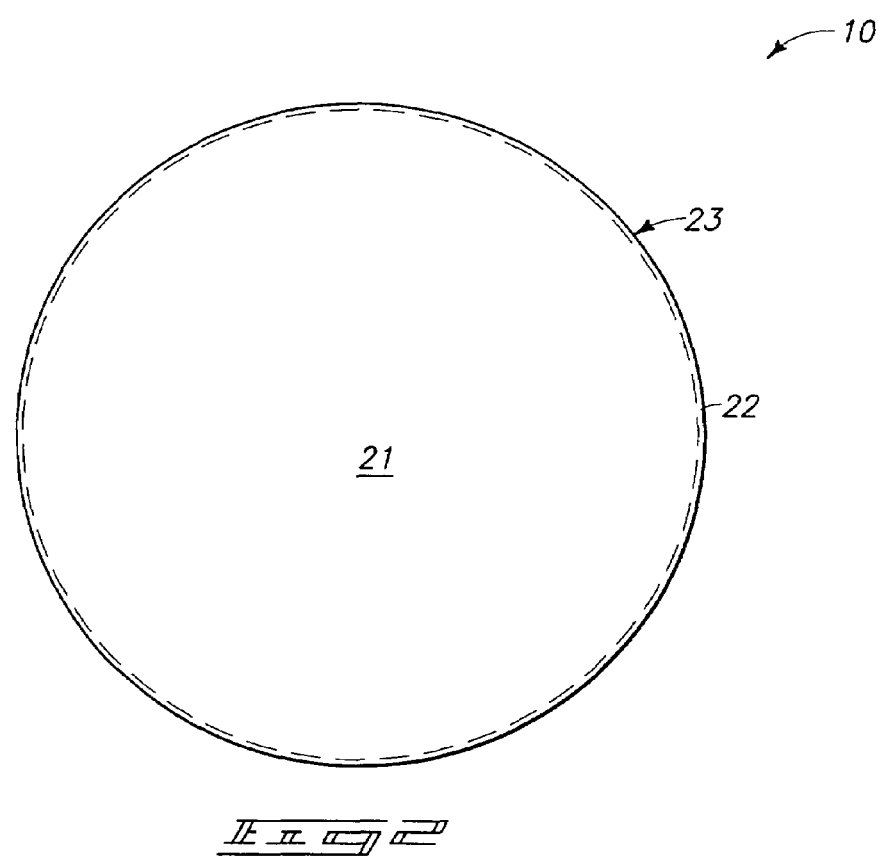

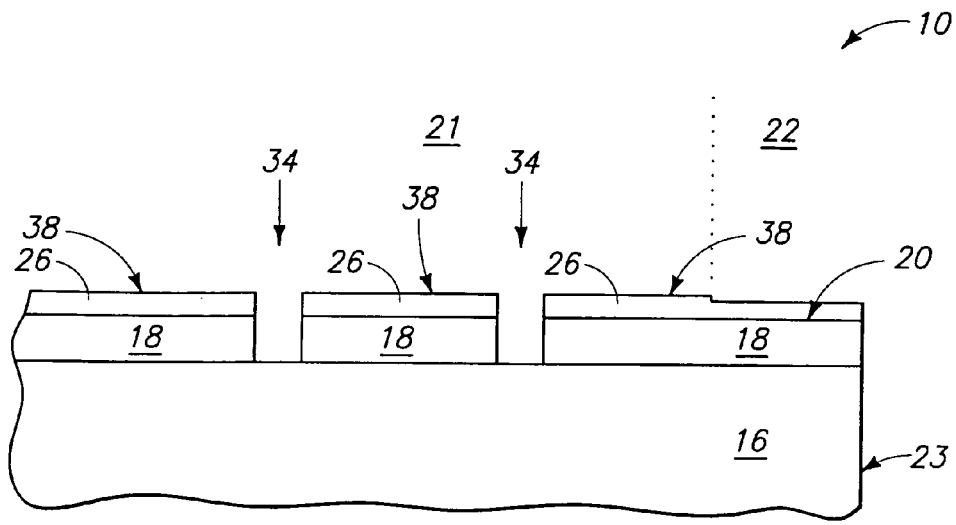
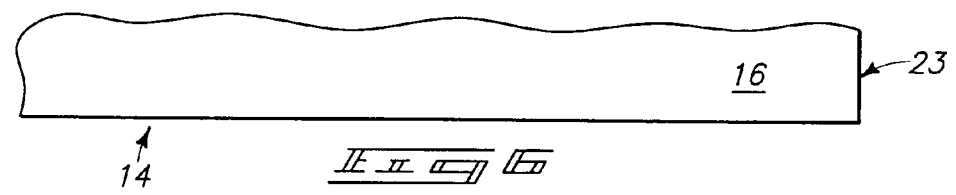
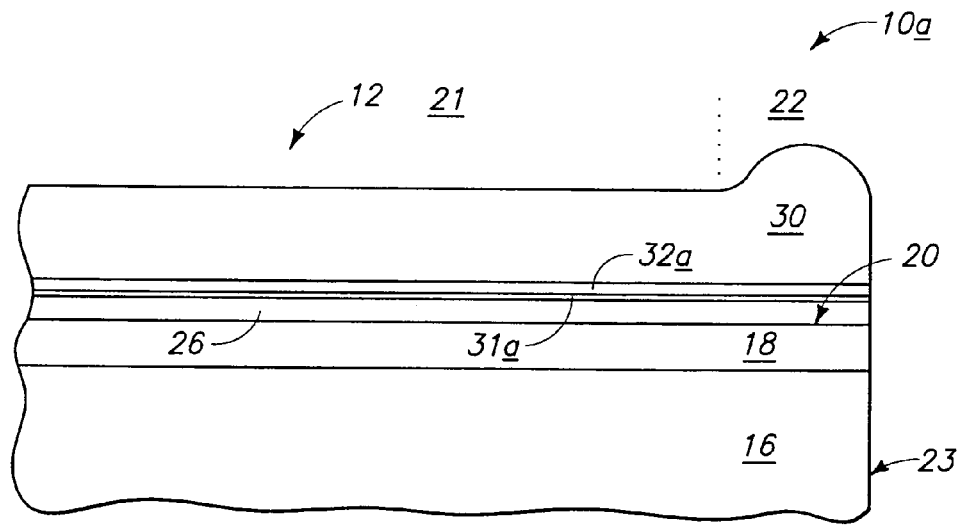
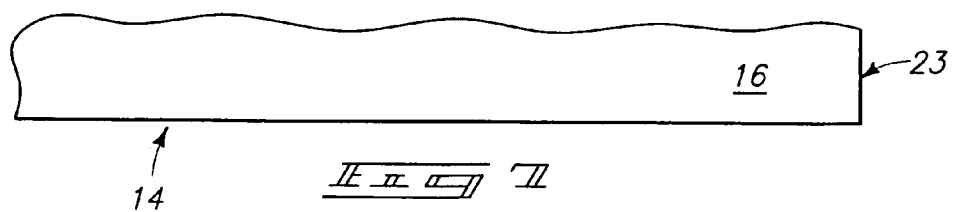

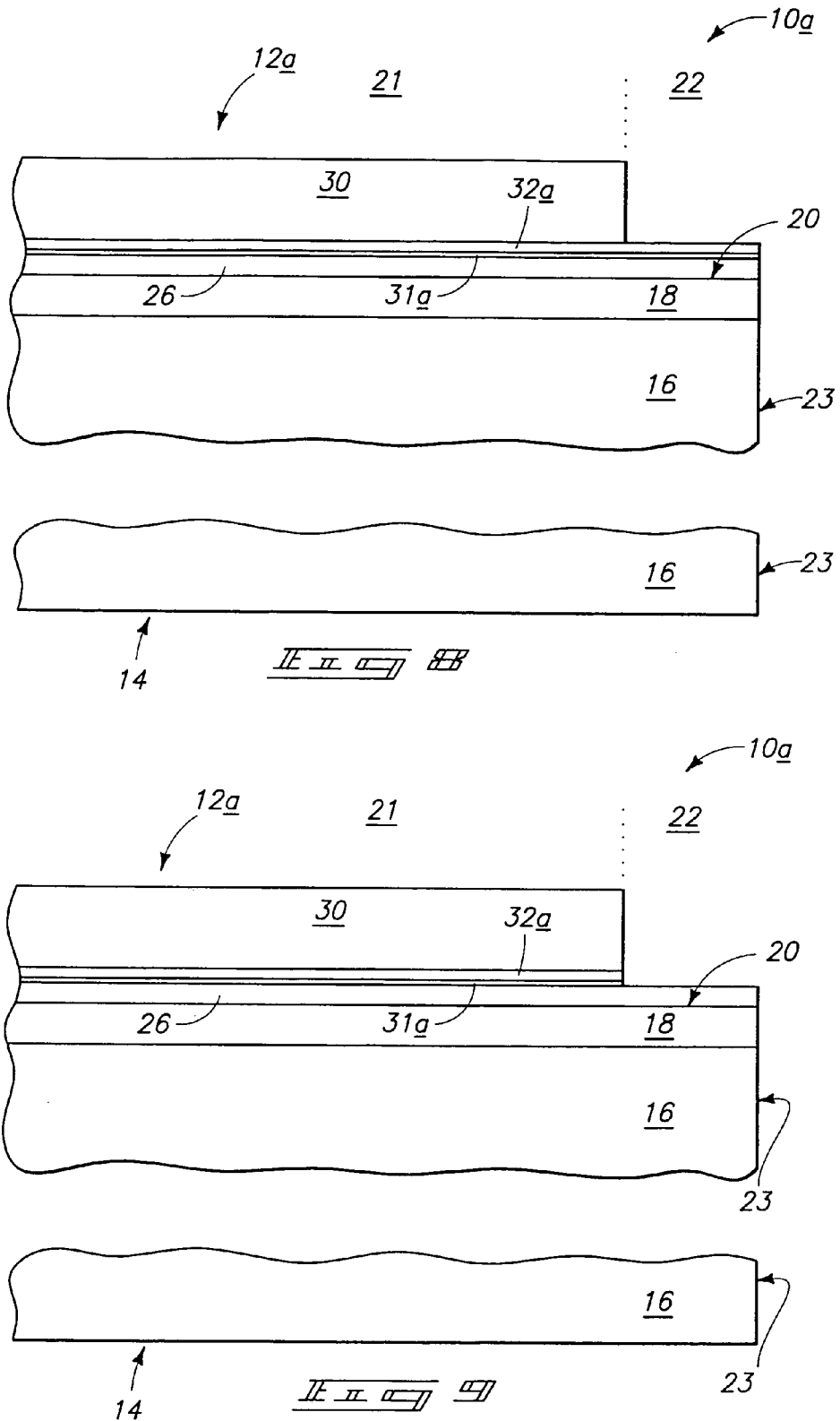

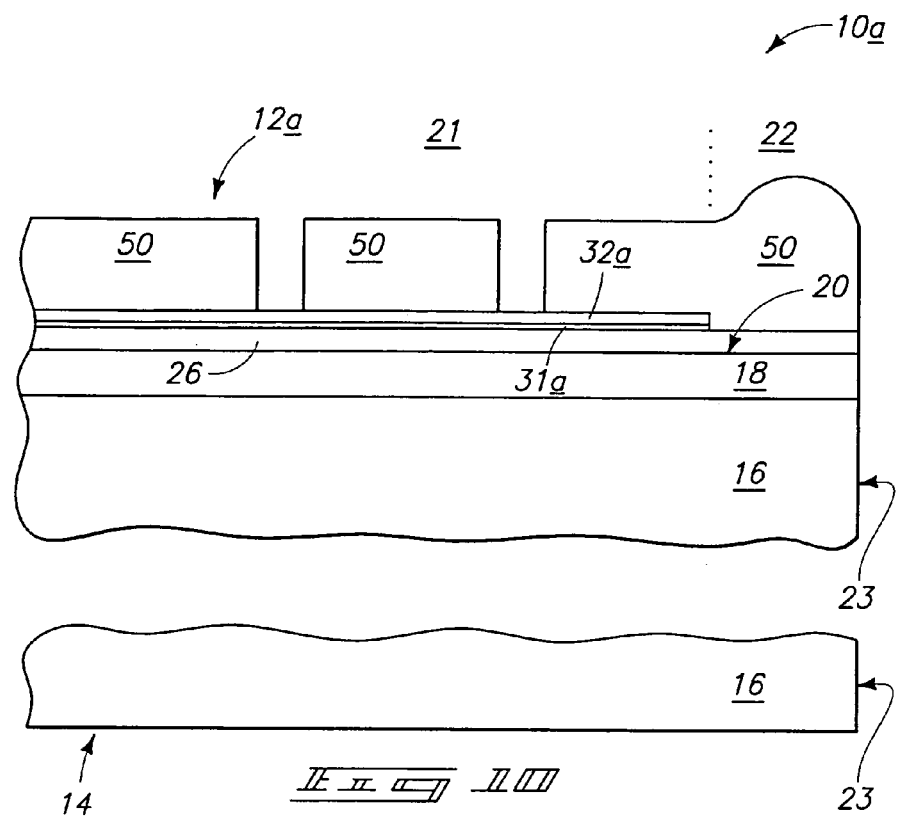
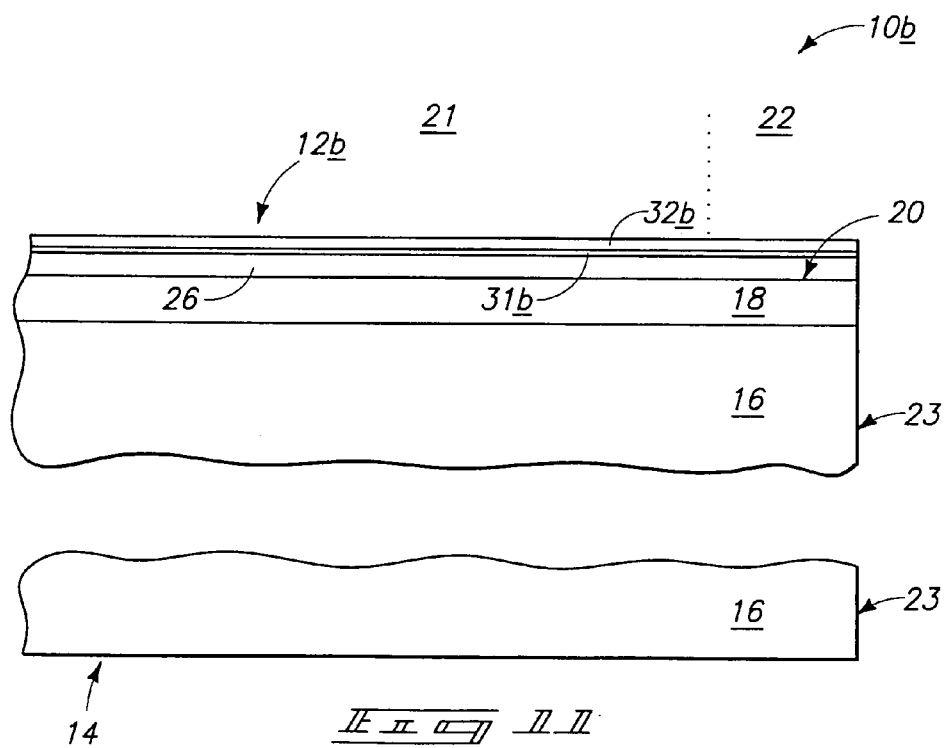

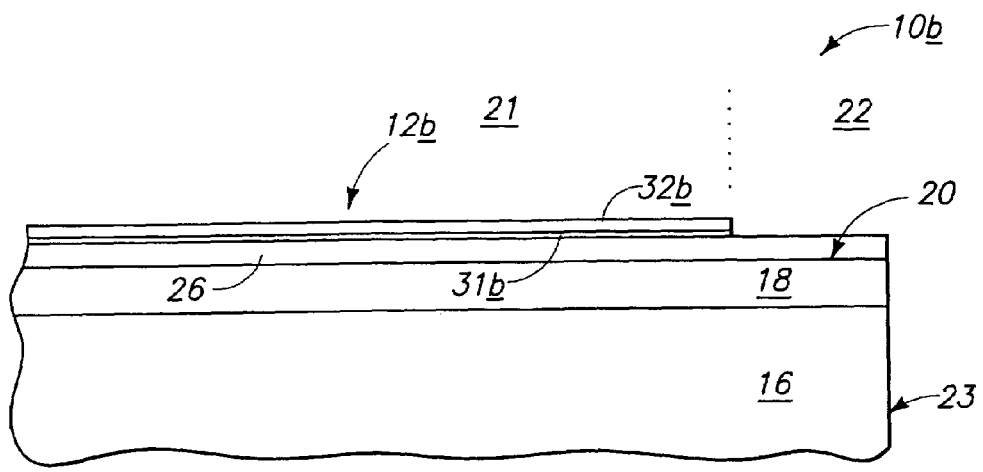
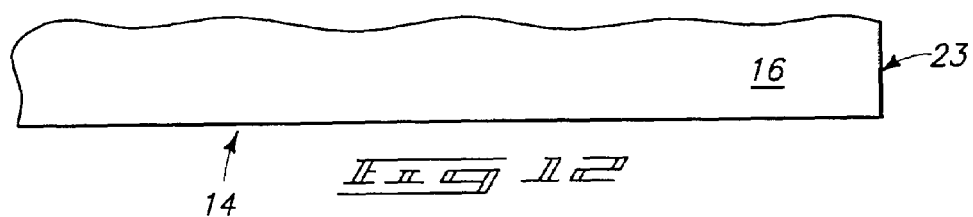
FIG. 12
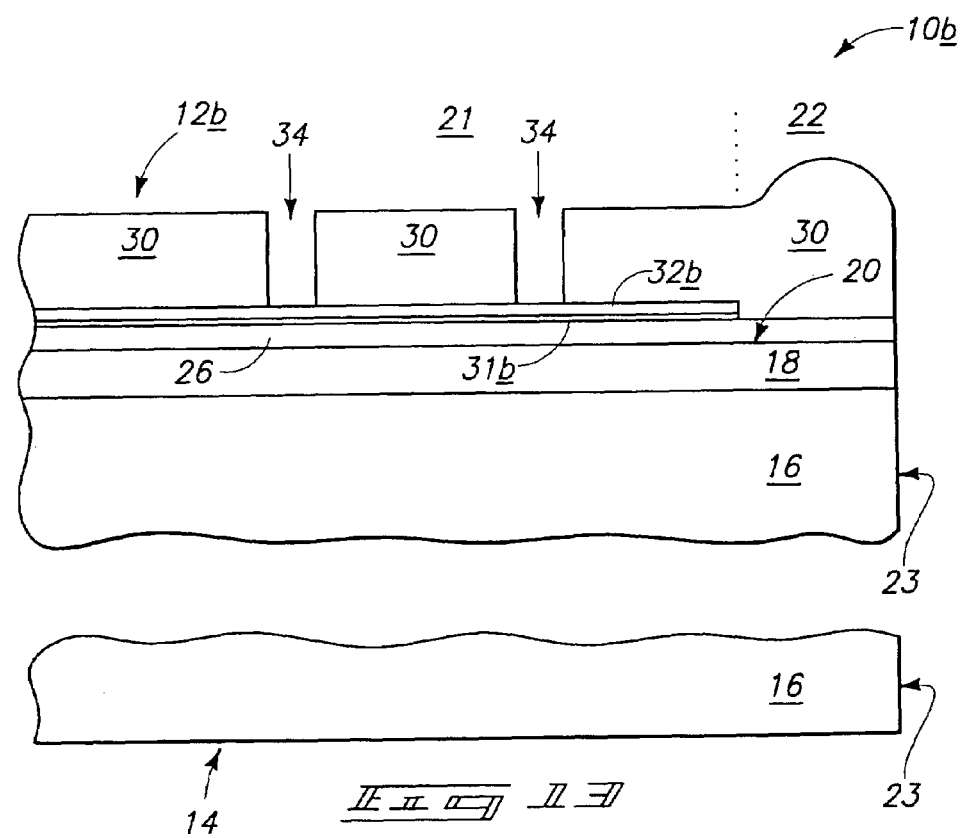
FIG. 13

METHODS OF PROCESSING A SEMICONDUCTOR SUBSTRATE

RELATED PATENT DATA

This patent resulted from a continuation application of U.S. patent application Ser. No. 10/848,030, filed May 17, 2004, entitled "Methods of Processing a Semiconductor Substrate", naming Jeffrey W. Honeycutt and Gurtej S. Sandhu as inventors, and now which is U.S. Pat. No. 7,115,524, the disclosure of which is incorporated by reference.

TECHNICAL FIELD

This invention relates to methods of processing a semiconductor substrate.

BACKGROUND OF THE INVENTION

Integrated circuits are typically formed on a semiconductor substrate, such as a silicon wafer or other semiconducting material. In general, layers of various materials which are either semiconducting, conducting or insulating are utilized to form the integrated circuits. By way of example, the various materials are doped, ion implanted, deposited, etched, grown, etc. using various processes. Further, a continuing goal in semiconductor processing is to continue to strive to reduce the size of individual electronic components, thereby enabling smaller and denser integrated circuitry.

One technique for patterning and processing semiconductor substrates is photolithography. Such typically includes deposition of a photoresist layer which can be processed to modify the solubility of such layer in certain solvents. For example, portions of the photoresist layer can be exposed through a mask/reticle to change the solvent solubility of the exposed regions versus the unexposed regions compared to the as-deposited state. Thereafter, the exposed or unexposed portions can be removed, depending on the type of photoresist, thereby leaving a masking pattern of the photoresist on the substrate. Adjacent areas of the substrate next to the masked portions can be processed, for example by etching or ion implanting, to effect the desired processing of the substrate adjacent the masking material.

In certain instances, multiple different layers of photoresist are utilized in a given masking/photolithographic step. Further, the photolithographic masking and patterning might be combined with one or more other layers. One such process forms what is commonly referred to as a "hard mask" over the substrate prior to deposition of the photoresist layer or layers. The photoresist layer is then patterned, for example as described above, to form masking blocks over the hard mask. The hard mask is then etched using the photoresist as a mask to transfer the pattern of the photoresist of the hard mask. The photoresist may or may not be removed immediately thereafter. Hard masks such as just described provide a more robust masking pattern than photoresist alone, for example should the photoresist be completely eroded/etched away.

One material utilized as a hard mask is amorphous carbon. The amorphous carbon might be doped with other materials, for example boron. When etching oxide material using an amorphous carbon as a hard mask, the etching typically removes the oxide at a rate of about ten times faster than it removes amorphous carbon.

In many instances, it is desirable to use an antireflective coating (with or without a hard mask) over which the photoresist is deposited. In the absence of an antireflective coating, some underlying substrates reflect a considerable amount of the incident radiation which can adversely affect the patterning of the photoresist. Accordingly even when using amorphous carbon hard mask patterning, an antireflective coating might be employed intermediate the amorphous carbon and the photoresist layer. The antireflective coating might be composed of a single layer, or multiple layers. For example, one antireflective coating might be inorganic, and another antireflective coating might be organic. For example in one implementation, an antireflective coating over amorphous carbon comprises a first inorganic layer and a second organic layer. Photoresist is deposited thereafter and, after photolithograrhic exposure and developing, openings are formed through the photoresist to the antireflective layer(s). The mask pattern in the photoresist layer is then typically transferred through the antireflective layer(s), and through the amorphous carbon layer, utilizing one or more dry anisotropic etching techniques. Then, one or more suitable different chemistries are typically utilized to extend the openings through the layer or layers inwardly of the amorphous carbon layer.

In typical photolithographic processing, depositing of the photoresist tends to form what is referred to as an "edge bead" which constitutes an excessive, thickened section of resist at the peripheral outer edge of the wafer or substrate. The edge bead can be several times as thick as the layer of resist which is more centrally received over the substrate. This can, in some instances, leave an edge bead of resist over the antireflective coating and over amorphous carbon in a peripheral region about the edge of the substrate after the mask pattern has been formed in the amorphous carbon layer. Such photoresist in the peripheral region and/or any antireflective coating can cause residual amorphous carbon and antireflective coating to remain on the substrate/wafer edge after dry etching and cleaning. Such can subsequently peel away later, and undesirably cause particle contamination.

The invention was motivated in addressing and improving upon the above-described issues. However, it is in no way so limited. The invention is only limited by the accompanying claims as literally worded (without interpretative or other limiting reference to the above background art description, remaining portions of the specification or the drawings), and in accordance with the doctrine of equivalents.

SUMMARY

The invention includes methods of processing semiconductor substrates. In one implementation, a semiconductor substrate is provided which has an outer surface. Such surface has a peripheral region received about a peripheral edge of the semiconductor substrate. A layer comprising amorphous carbon is provided over the substrate outer surface. A masking layer is provided outwardly of the amorphous carbon-comprising layer. A resist layer is provided outwardly of the masking layer. At least a portion of the peripheral region of the outer surface includes the amorphous carbon-comprising layer and the resist layer, but is substantially void of the masking layer. The amorphous carbon-comprising layer is patterned using the resist layer and the masking layer effective to form a mask over the semiconductor substrate. After the patterning, the semiconductor substrate is processed inwardly of the mask through openings formed in the mask.

BRIEF DESCRIPTION OF THE DRAWINGS

Preferred embodiments of the invention are described below with reference to the following accompanying drawings.

FIG. 1 is a diagrammatic sectional view of a semiconductor substrate fragment at a point of processing in accordance with an aspect of the invention.

FIG. 2 is a reduced scale, top plan, view of a substrate incorporating the semiconductor substrate fragment of FIG. 1.

FIG. 6 is a view of the FIG. 4 substrate fragment at a processing point subsequent to that depicted by FIG. 4.

FIG. 7 is a diagrammatic sectional view of a semiconductor substrate fragment at a point of processing in accordance with an aspect of the invention.

FIG. 8 is a view of the FIG. 7 substrate fragment at a processing point subsequent to that depicted by FIG. 7.

FIG. 9 is a view of the FIG. 8 substrate fragment at a processing point subsequent to that depicted by FIG. 8.

FIG. 10 is a view of the FIG. 9 substrate fragment at a processing point subsequent to that depicted by FIG. 9.

FIG. 11 is a diagrammatic sectional view of a semiconductor substrate fragment at a point of processing in accordance with an aspect of the invention.

FIG. 12 is a view of the FIG. 11 substrate fragment at a processing point subsequent to that depicted by FIG. 11.

FIG. 13 is a view of the FIG. 12 substrate fragment at a processing point subsequent to that depicted by FIG. 12.

DETAILED DESCRIPTION OF THE PREFERRED EMBODIMENTS

Figure 3:
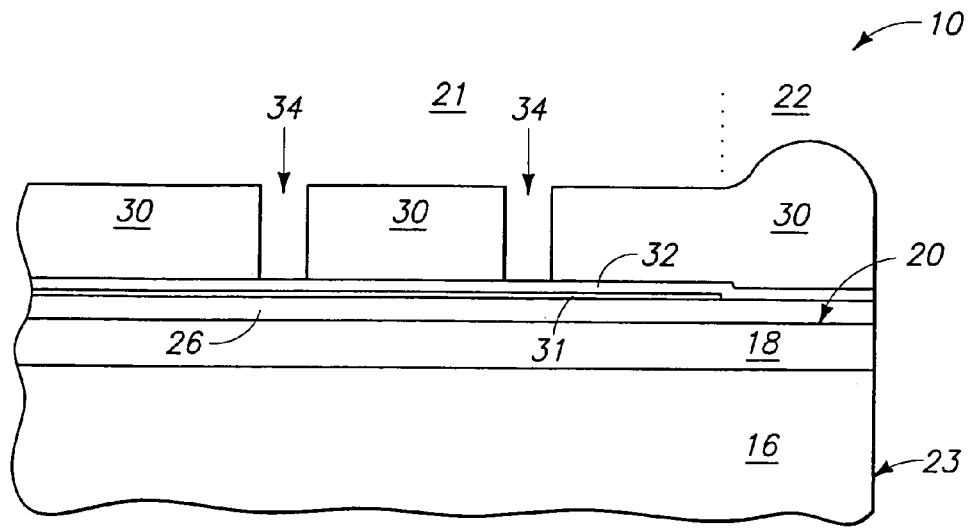
FIG. 3 is a view of the FIG. 1 substrate fragment at a processing point subsequent to that depicted by FIG. 1.

This disclosure of the invention is submitted in furtherance of the constitutional purposes of the U.S. Patent Laws "to promote the progress of science and useful arts" (Article 1, Section 8).

A method of processing a semiconductor substrate in accordance with some aspects of the invention is initially described with references to FIGS. 1-6. Referring initially to FIGS. 1 and 2, a semiconductor substrate is indicated generally with reference numeral 10, and comprises a first or front side 12 and a second or back side 14. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. By way of example only, substrate 10 is depicted as comprising bulk semiconductor material 16, such as monocrystalline silicon. A layer 18 is formed over substrate material 16 on substrate first side 12. In the described exemplary embodiment, layer 18 will be etched, although any other processing thereof (whether existing or yet-to-be developed) using a masking as described below is also, of course, contemplated. One exemplary material for layer 18 includes a silicon dioxide, such as borophosphosilicate glass (BPSG).

Semiconductor substrate 10 can be considered as having an outer surface 20 on first side 12. Substrate 10 is encompassed by a peripheral edge 23. Outer surface 20 can be considered as having a peripheral region 22 received about edge 23. Outer surface 20 can also be considered as having a central region 21 received radially inward of peripheral region 22. In the context of the processing which follows, peripheral region 22 is preferably at least 0.5 mm wide, and more preferably from 0.5 mm to 3.5 mm wide.

Referring to FIG. 3, a layer 26 comprising amorphous carbon has been provided over (and preferably "on", as shown) substrate outer surface 20. A masking layer 31 is provided to be received outwardly of amorphous carbon-comprising layer 26, and a resist layer 30 (preferably a photoresist) is provided to be received outwardly of masking layer 31. At least a portion of the peripheral region 22 outer surface 20 comprises amorphous carbon-comprising layer 26 and resist layer 30, but is substantially void of masking layer 31. Most preferably, all of peripheral region 22 is void of masking layer 31. Alternately but less preferred, the portion of peripheral region 22 not having masking layer 31 is some portion less than all of the peripheral region, with in one embodiment such portion being at least a majority portion of the peripheral region.

Amorphous carbon-comprising layer 26 might comprise, consist essentially of, or consist of amorphous carbon, and which is either doped or undoped, for example with boron. A preferred thickness range is from 500 Angstroms to 10,000 Angstroms. In one exemplary embodiment, layer 26 might be provided by chemical vapor deposition using at least one of $C_2H_6$, $C_2H_4$, $C_2H_2$, $C_3H_6$ and $C_3H_8$. Further where boron doping is desired, the chemical vapor depositing might use at least one of $B_2H_6$, $B_4H_{10}$ and $BH_3CO$, thereby forming the amorphous carbon to be in situ boron doped as-deposited. Doping with any other material, with or without boron is also of course contemplated. U.S. patent application Ser. No. 10/463,185, filed on Jun. 17, 2003, entitled "Boron-Doped Amorphous Carbon Film For Use As A Hard Etch Mask During The Formation Of A Semiconductor Device", naming Zhiping Yin and Gurtej Sandhu as inventors, is hereby incorporated by reference (now U.S. Pat. No. 6,939,794).

In one exemplary embodiment, masking layer 31 comprises an antireflective coating, and more preferably an inorganic antireflective coating, for example silicon oxynitrides ($SiO_xN_y$). A preferred thickness range is from 100 Angstroms to 1,000 Angstroms. Further by way of example only, other exemplary materials independent of antireflective characteristics for masking layer 31 include carbides (i.e., BC, SiC), silicon in elemental crystalline form (i.e., monocrystalline silicon or polycrystalline silicon), conductive elemental metals (i.e., W, Ti), alloys of elemental metals, conductive metal compounds (i.e., conductive metal nitrides, for example TiN and WN), other non-conductive nitrides (i.e., BN, $Si_3N_4$) and silicon oxides (i.e., $SiO_2$).

In one preferred embodiment, a material different from that of the masking layer is provided intermediate the resist and the amorphous carbon-comprising layer. By way of example only, example materials include antireflective coatings, more preferably organic antireflective coatings, such as BARCs, for example DUV112 available from Brewer Science of Rolla, Mo. FIG. 3 depicts such a material 32, and which is received over masking layer 31 and over peripheral region 22. A preferred thickness range is from 100 Angstroms to 1,000 Angstroms.

Resist layer 30 is preferably a photoresist, and can be either a negative photoresist or a positive photoresist. Positive photoresists are preferred. In the illustrated embodiment, resist layer 30 is shown to be thicker over at least some portion of peripheral region 22 than over central region 21, at least at this point in the process, although such is in no way required in all aspects of the invention. By way of example only, resist layer 30 is shown as having been patterned in some manner to form a pair of openings 34 therein. An exemplary technique includes photolithographic exposure to suitable incident radiation and subsequent development.

Figure 4:
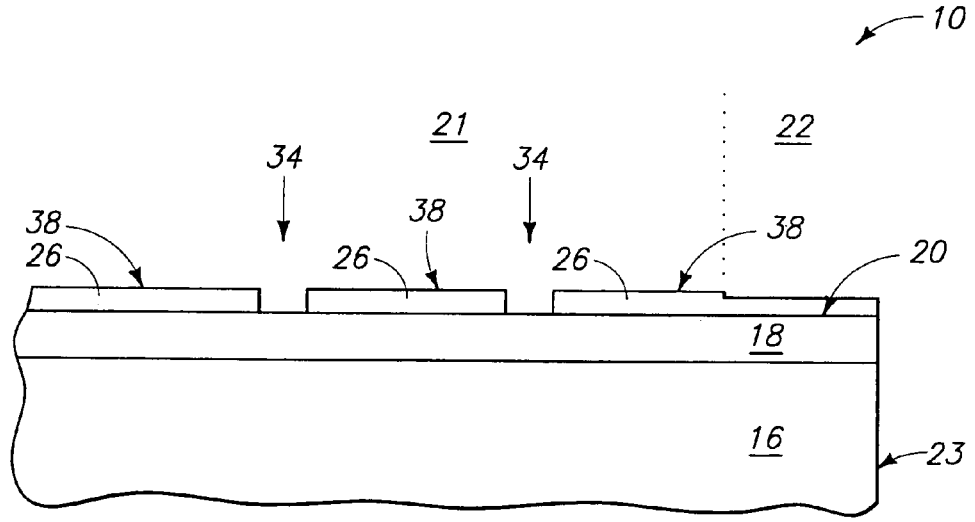
FIG. 4 is a view of the FIG. 3 substrate fragment at a processing point subsequent to that depicted by FIG. 3.

Referring to FIG. 4, amorphous carbon-comprising layer 26 has been patterned, at least in part, using resist layer 30 of FIG. 3 (not shown in FIG. 4) and masking layer 31 of FIG. 3 (not shown in FIG. 4) effective to form a mask 38 over/as part of semiconductor substrate 10. FIG. 4 also depicts resist layer 30 and masking layer 31 as having been removed at the conclusion of formation of mask 38. By way of example only, preferred techniques for processing the substrate of FIG. 3 to produce the substrate of FIG. 4 include a suitable dry anisotropic etch using a $CF_4$ chemistry to extend openings 34 in FIG. 3 through layers 32 and 31 to amorphous carbon-comprising layer 26 where, for example, layers 31 and 32 comprise $SiO_xN_y$, and Brewer Science BARO products respectively. Only some, a majority, most or all of photoresist 30 might be removed during such etching depending upon the composition of resist 30, its thickness, and the etching chemistry utilized. Regardless, after etching through layers 31 and 32, openings 34 can be extended into amorphous carbon-comprising layer 26 utilizing a dry anisotropic etch preferably principally including a $SO_2$ chemistry.

Figure 5:
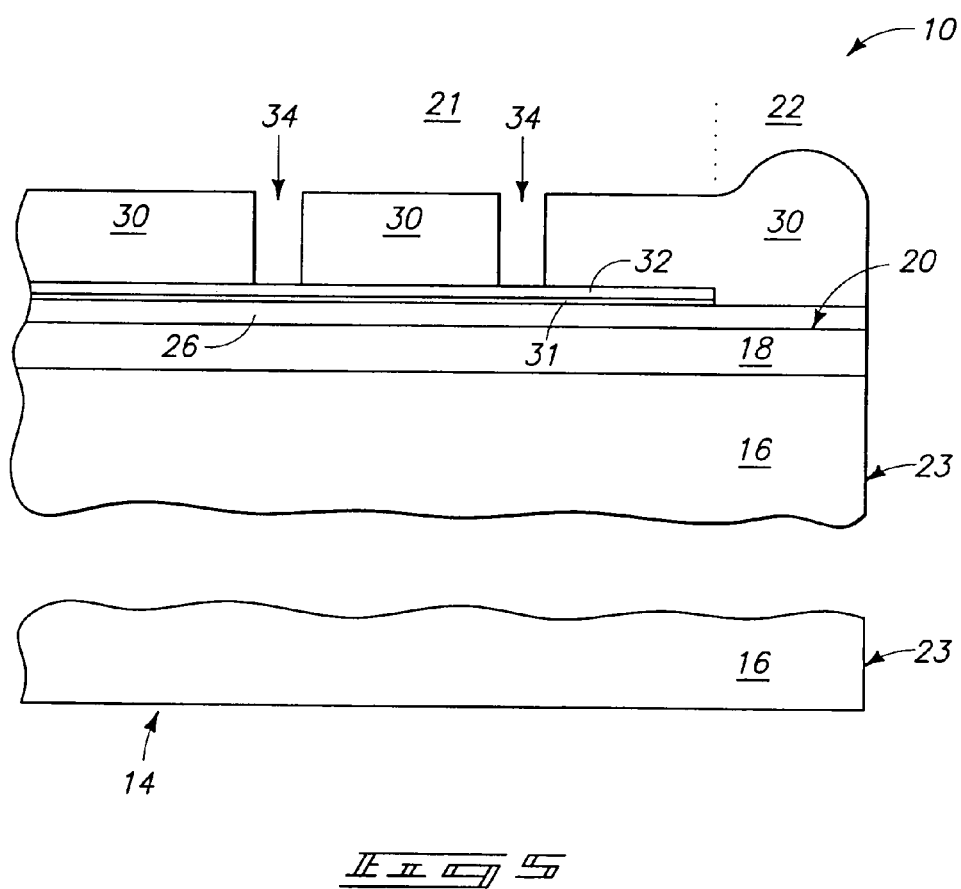
FIG. 5 is a view of the FIG. 1 substrate fragment at a processing point subsequent to that depicted by FIG. 1, and alternate to that depicted by FIG. 3.

FIG. 3 essentially depicts material 32 being received over the portion of peripheral region 22 during the patterning to produce FIG. 4. Alternately, material 32 might not be received over the portion of peripheral region 22 during the patterning to produce FIG. 4, for example as shown in FIG. 5 for a substrate 100 as an exemplary alternate to FIG. 3. Further, material 32 might be eliminated/not used altogether, or alternately even multiple materials used in addition to masking layer 31.

The thickened resist portion shown over at least some of peripheral region 22 may or may not occur at all, and at different times if such does occur. For example, it may appear only after a partial or initial dry develop of layer 31 (and material 32 when used), or only after such layer(s) has/have been fully developed by extending openings 34 therethrough, or maybe not until etching completely through layer 26. A reason is that during a dry etch, polymer formation from such etch can occur faster at the periphery of the substrate than centrally. This polymer can form on top of the deposited resist and block removal of material therebeneath during the dry etch. Material beneath the resist in turn can block amorphous carbon removal during strip of the resist. Eliminating the masking layer 31 (most commonly an inorganic antireflective coating) from at least some, and preferably all, of the peripheral region can overcome this problem. Further, the peripheral region might be thicker due to reasons other than photoresist application and processing, for example due to a thicker portion of the amorphous carbon being formed at the periphery during its formation.

Preferably and as shown, mask 38 masks at least a portion of peripheral region 22, and more preferably masks all of peripheral region 22, and with at least amorphous carbon-comprising layer 26. Some of amorphous carbon-comprising layer 26 might also be etched in peripheral region 22 as compared to central region 21, as shown, due to lack of masking layer 31 in peripheral region 22.

Referring to FIG. 6, semiconductor substrate 10 has been processed inwardly of mask 38 through openings 34 formed in mask 38. The typical and preferred form of processing is etching, although other forms of processing, whether existing or yet-to-be developed, might additionally or alternately be utilized (i.e., ion implanting). Typically, mask 38/layer 26 would then be removed, although such is of course not required.

Various possible methods might be utilized in developing the exemplary constructions of FIGS. 3 and 4 (including methods yet-to-be developed) in carrying out the collective methodical aspects of claim 1 in this patent application as initially filed. For example, the provision of masking layer 31 might result, in part, from forming some or all of masking layer 31 over peripheral region 22 and subsequently removing it from over all or a portion of peripheral region 22. Alternately by way of example only, the provision of masking layer 31 might occur by deposition methods wherein the depositing of a masking layer 31 does not ever occur in some or all of a portion of peripheral region 22.

For example with respect to this latter described aspect, an amorphous carbon-comprising layer 26 could be blanketly deposited over an entirety of semiconductor substrate outer surface 20. Thereafter, all of the peripheral region might be masked while depositing a masking layer 31 over central region 21 such that peripheral region 22 is substantially void of masking layer 31. By way of example only, such could occur by utilizing a substantially anisotropic deposition, for example using dry plasma directional deposition wherein a masking shield/rim is positioned over the substrate to mask all of peripheral region 22 while leaving central portion 21 exposed to the deposition of masking layer 31. Thereafter, a resist could be blanketly deposited over an entirety of the semiconductor substrate outer surface. Patterning of the amorphous carbon-comprising layer and subsequent processing of the semiconductor substrate inwardly of the mask could then occur, for example as described above.

The invention also, by way of example only, contemplates forming the masking layer over the peripheral region, and subsequently removing it from over at least a portion of the peripheral region. By way of examples only, a first exemplary such process is described with reference to FIGS. 7-10, and a second exemplary process is described with reference to FIGS. 11-13.

Referring first to FIG. 7, an alternate embodiment semiconductor substrate is indicated generally with reference numeral 10a. Like numerals from the first described embodiments are utilized where appropriate, with differences being indicated with the suffix "a" or with different numerals. Amorphous carbon-comprising layer 26 has been blanketly deposited over an entirety of semiconductor substrate outer surface 20. A masking layer 31a and an optional another material 32a have been blanketly deposited over amorphous carbon-comprising layer 26 over an entirety of semiconductor substrate outer surface 20. A first resist layer 30 has been blanketly deposited over masking layer 31a (and over material 32a) over an entirety of semiconductor substrate outer surface 20. Exemplary thicknesses and materials are as described above with the first embodiments.

Referring to FIG. 8, first layer of resist 30 has been removed from over all of peripheral region 22 while leaving central region 21 covered with first layer of resist 30. Any existing or yet-to-be developed method(s) for forming the exemplary substrate FIG. 8 processing is of course contemplated. One exemplary (but lesser preferred) method includes a photolithographic masking step and subsequent wet develop. A more preferred technique comprises spraying a resist solvent onto the substrate while spinning the substrate, for example by some form of chemical edge bead removal of photoresist as is conventional in the existing state of the art. One such process would spray a suitable photoresist solvent onto back side 14 of substrate 10a while spinning the substrate. Alternately or in addition thereto, a method might be utilized whereby a suitable photoresist solvent is sprayed peripherally onto front side 12 of a spinning substrate and, regardless, ideally in such a manner that photoresist 30 remains over central region 21 and is completely removed from peripheral region 22. By way of example only, an exemplary solution for doing so includes RER450 available from Arch Chemicals of Norwalk, Conn., and understood to principally comprise diacetone alcohol.

Referring to FIG. 9, at least some of the peripheral region masking layer 31*a* (and preferably all, as shown) is removed from over peripheral region 22, while central region 21 remains covered with some portion of first layer of resist 30. An exemplary technique for doing so includes dry anisotropic etching utilizing resist layer 30 as a mask, for example using $CF_4$ and/or other fluorocarbon chemistries. Where material 32*a* is used, a corresponding at least some of the peripheral material 32*a* is also of course removed from over peripheral region 22.

After removing at least some of masking layer 31*a* from peripheral region 22, the remaining portions of first layer of resist 30 are removed from the substrate. Of course, any suitable existing or yet-to-be developed methods can be utilized, for example using an $O_2$ plasma ashing processing.

Referring to FIG. 10 and after having removed first layer of resist 30, a second layer of resist 50 is blanketly deposited over an entirety of semiconductor substrate outer surface 20 to produce, in the exemplary described process, essentially the same substrate depicted by FIG. 5. Subsequent patterning of the amorphous carbon-comprising layer and processing of the substrate inwardly thereof (not shown) can then be conducted as described above, or otherwise.

By way of example only, a method is described with reference to FIGS. 11-13 with respect to a semiconductor substrate 10*b*. Like numerals from the first described embodiments are utilized where appropriate, with differences being indicated by the suffix "b" or with different numerals. Referring to FIG. 11, an amorphous carbon-comprising layer 26 has been blanketly deposited over an entirety of semiconductor substrate outer surface 20. A masking layer 31*b* has been blanketly deposited over amorphous carbon-comprising layer 26 over an entirety of semiconductor substrate outer surface 20. An optional material 32*b* has also been deposited, over layer 31*b* as shown. Exemplary thicknesses and materials are as described above with the first embodiments.

Referring to FIG. 12, at least some of masking layer 31*b* (and preferably all, as shown) has been removed from over all of peripheral region 22 while leaving central region 21 covered with masking layer 31*b*. One exemplary manner of doing so is as described above with respect to FIGS. 7-10. Where material 32*b* is used, a corresponding at least some of the peripheral material 32*b* is also of course removed from over peripheral region 22.

Alternately, the removing of at least some of the masking layer from over all of the peripheral region could comprise spraying a masking layer solvent onto the substrate while spinning the substrate. In other words, the masking layer could be removed in a manner analogous to that described above with respect to the FIGS. 7-10 embodiment whereby resist 30 was removed from over the peripheral region. For example, one or more suitable masking layer solvents (including a material 32*b* solvent where material 32*b* is used) could be sprayed onto back side 14 of substrate 10*b* while spinning the substrate, and/or peripherally onto the front side of the substrate. Where multiple different materials or layers of different materials are utilized, multiple different solvents might be sprayed onto the wafer. For example and by way of example only, HF solutions will remove $SiO_xN_y$ layers, and the above exemplary RER450 solution will remove organic antireflective coatings.

Referring to FIG. 13, a resist layer 30 has been blanketly deposited over an entirety of semiconductor substrate outer surface 20, and otherwise processed to produce the exemplary construction of FIG. 5. Subsequent patterning of the amorphous carbon-comprising layer and processing the semiconductor substrate inwardly of the resulting mask can, of course, occur as described in the above exemplary first embodiment.

In one preferred aspect, and prior to patterning the amorphous carbon-comprising layer, the resist in only the peripheral region is exposed to incident radiation at an energy density of at least 200 mW/cm$^2$ (more preferably an energy density of at least 300 mW/cm$^2$) for a period of time effective to prevent resist dissolution in the peripheral region during a development process of the resist. An exemplary preferred technique would use a broadband UV lamp at 300 mW/cm$^2$ for 60 seconds.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of processing a semiconductor substrate, comprising:
   providing a semiconductor substrate having an outer surface, the outer surface having a peripheral region received about a peripheral edge of the semiconductor substrate;
   providing a layer comprising amorphous carbon over the substrate outer surface, a masking layer in direct physical touching contact with the amorphous carbon-comprising layer, and a resist layer in direct physical touching contact with the masking layer; at least a portion of the peripheral region of the outer surface comprising the amorphous carbon-comprising layer and the resist layer but which is substantially void of the masking layer;
   patterning the amorphous carbon-comprising layer using the resist layer and the masking layer effective to form a mask over the semiconductor substrate, the amorphous carbon-comprising layer in the portion extending to the peripheral edge at least at starting of said patterning with the resist layer; and
   after the patterning, etching the semiconductor substrate inwardly of the mask through openings formed in the mask.

2. The method of claim 1 wherein the portion is at least a majority portion of the peripheral region.

3. The method of claim 1 wherein the portion is all of the peripheral region.

4. The method of claim 1 wherein the portion is less than all of the peripheral region.

5. The method of claim 1 wherein the peripheral region is at least 0.5 mm wide.

6. The method of claim 1 wherein the outer surface comprises a central region received radially inward of the peripheral region, the resist layer being thicker over at least some portion of the peripheral region than over the central region at least prior to patterning of the amorphous carbon-comprising layer.

7. The method of claim 1 wherein the mask masks at least a portion of the peripheral region.

8. The method of claim 1 wherein the mask masks all of the peripheral region.

9. The method of claim 1 wherein the mask masks all of the peripheral region with at least the amorphous carbon-comprising layer.

10. The method of claim 1 wherein the providing the masking layer comprises forming the masking layer over all of the peripheral region and subsequently removing it from over the portion.

11. The method of claim 1 wherein the providing the masking layer comprises depositing, said depositing not occurring over the portion.

12. The method of claim 1 further comprising prior to patterning the amorphous carbon-comprising layer, exposing the resist in only the peripheral region to incident radiation at an energy density of at least 200 mW/cm$^2$ for a period of time effective to prevent resist dissolution in the peripheral region during a process of the resist.

13. The method of claim 12 wherein the incident radiation is at an energy density of at least 300 mW/cm$^2$.

14. The method of claim 1 wherein the amorphous carbon-comprising layer consists essentially of amorphous carbon.

15. The method of claim 1 wherein the amorphous carbon-comprising layer comprises boron.

* * * * *